United States Patent [19]
Vogelsberg et al.

[11] 3,979,897
[45] Sept. 14, 1976

[54] METHOD FOR LOCATING CONDUCTOR BREAKS DURING THE TWO STAGE TWISTING OF A COMMUNICATIONS CABLE

[75] Inventors: Dieter Vogelsberg, Berlin; Horst Reil, Neustadt, Coburg; Peter Froscher, Berlin, all of Germany

[73] Assignee: Siemens Aktiengesellschaft, Munich, Germany

[22] Filed: Jan. 23, 1975

[21] Appl. No.: 543,541

[30] Foreign Application Priority Data
Jan. 25, 1974 Germany............................ 2404094

[52] U.S. Cl. .............................. 57/156; 57/34 AT; 57/81
[51] Int. Cl.² ..................... H01B 13/04; D07B 3/00
[58] Field of Search ................. 57/19, 34 AT, 34 R, 57/61, 78, 80, 81, 156, 160, 166

[56] References Cited
UNITED STATES PATENTS

| | | | |
|---|---|---|---|
| 3,140,577 | 7/1964 | Ash ................................ | 57/34 AT |
| 3,412,544 | 11/1968 | Sugi et al........................ | 57/34 AT |
| 3,481,127 | 12/1969 | Vogelsberg...................... | 57/34 AT |
| 3,491,525 | 1/1970 | Sugi................................ | 57/34 AT |
| 3,659,406 | 5/1972 | Kipperberg........................ | 57/81 X |
| 3,884,024 | 5/1975 | Oestreich et al. ................ | 57/34 AT |
| 3,884,025 | 5/1975 | Oberender et al. ............... | 57/34 AT |
| 3,921,381 | 11/1975 | Vogelsberg .......................... | 57/156 |

*Primary Examiner*—John Petrakes
*Attorney, Agent, or Firm*—Kenyon & Kenyon Reilly Carr & Chapin

[57] ABSTRACT

To localize a conductor break occurring in a conductor being twisted into a communications cable in a two stage twisting operation the faulty wire is first ascertained and the fault in that wire then subsequently located using a probe placed between the twisting apparatus and a take up drum, with the twisting process then stopped and the fault corrected. In one particular embodiment which is disclosed all wires are short circuited, for example, at the end of the twisted cable which is wound on the take up drum, the wires entering the twisting arrangement are divided into two groups of equal size with each of the groups connected to one end of an *a–c* voltage source symmetrical with respect to ground through high resistance series resistors with the voltage drop at the series resistors then detected to locate the faulty wire and the probing of the twisted structure done capacitively using a probe for determining the exact fault location.

10 Claims, 7 Drawing Figures

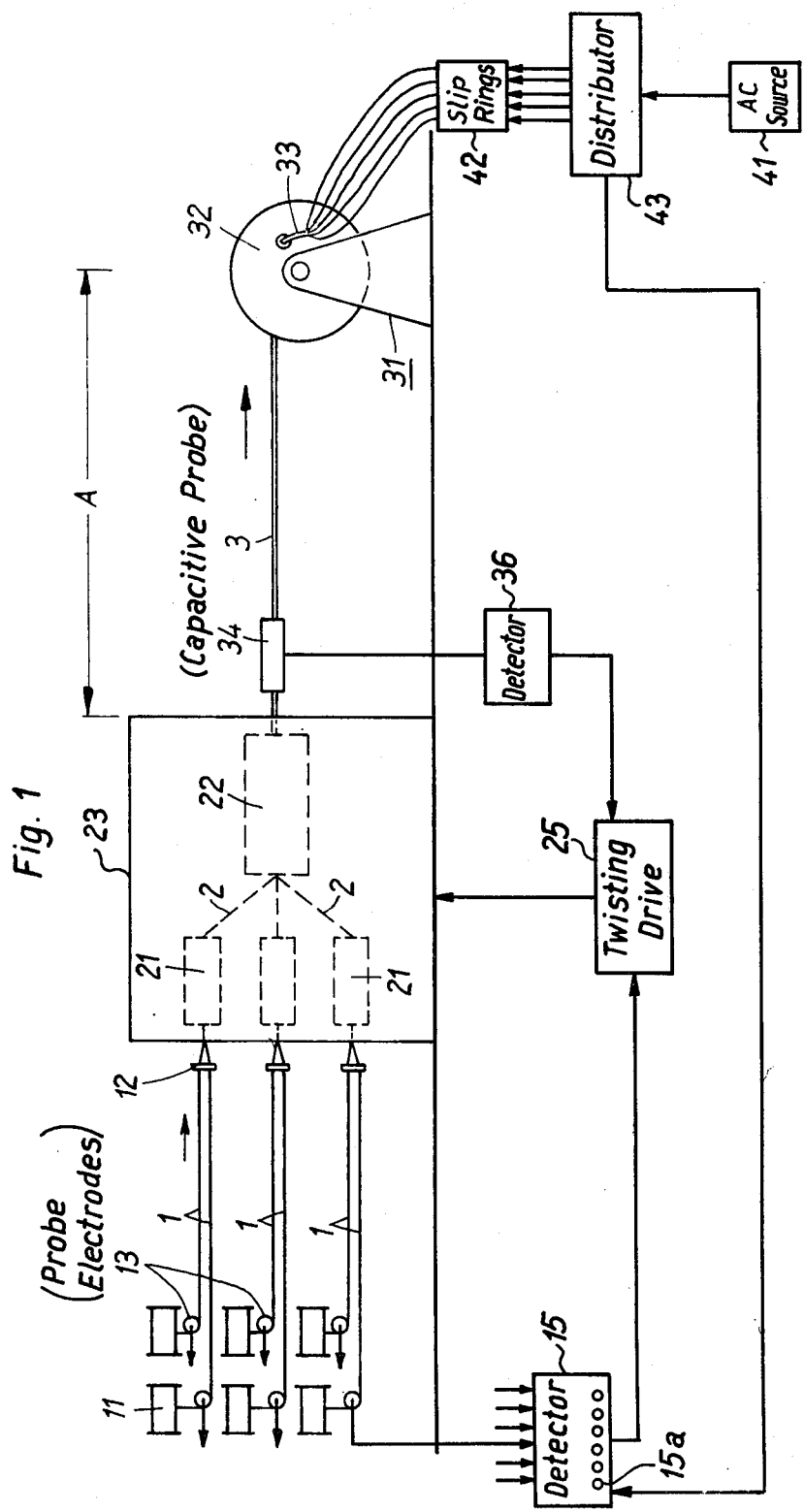

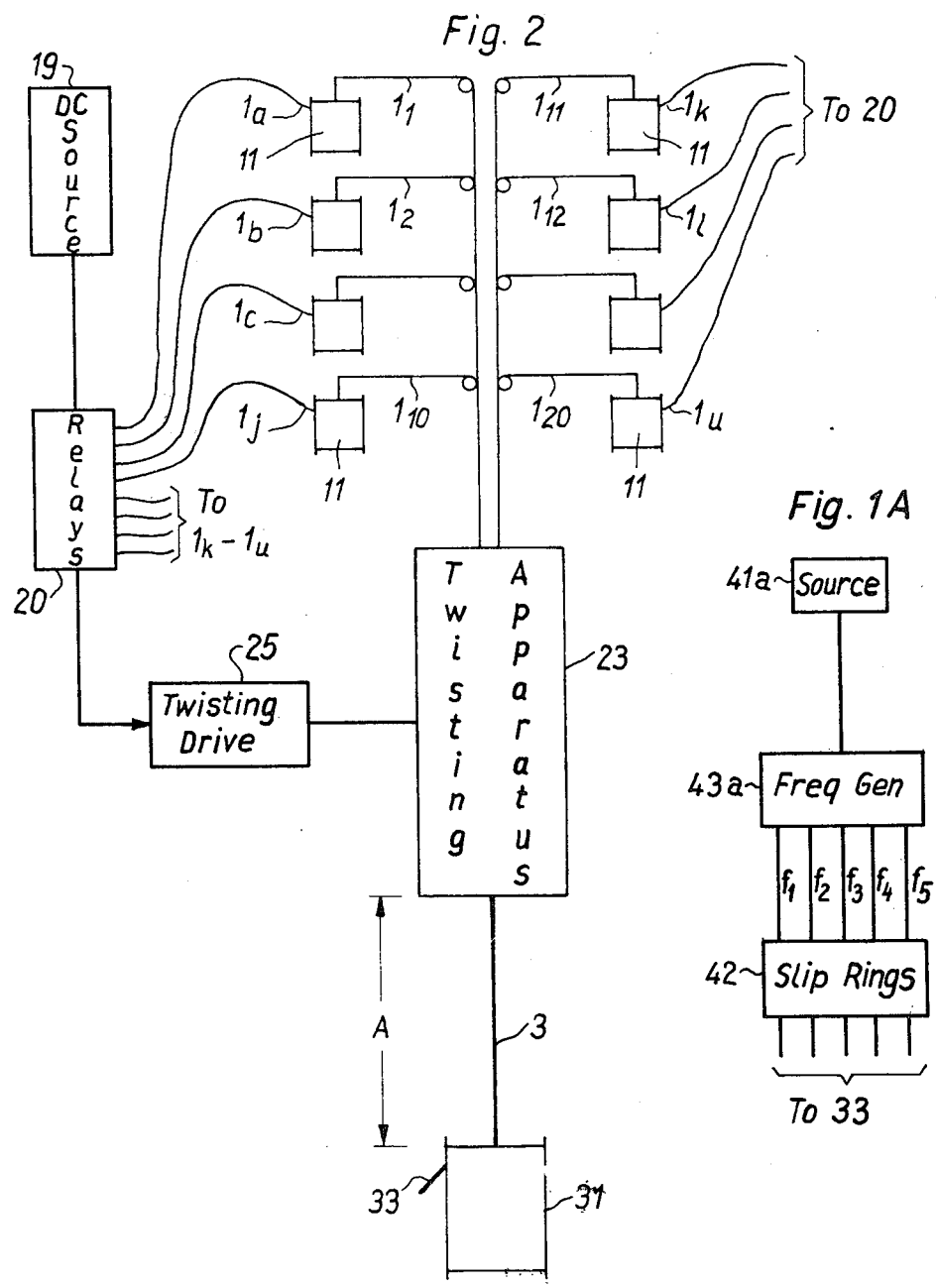

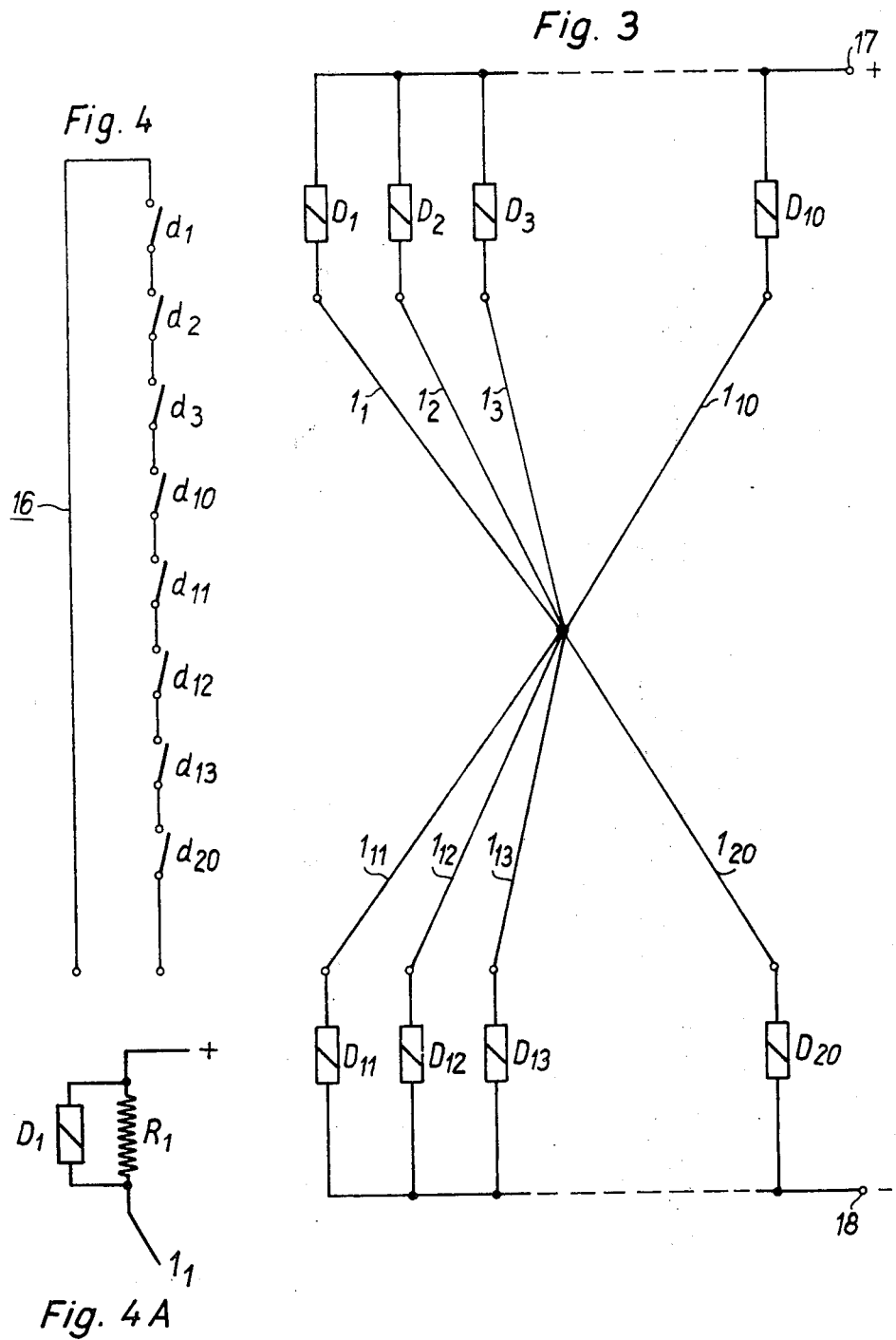

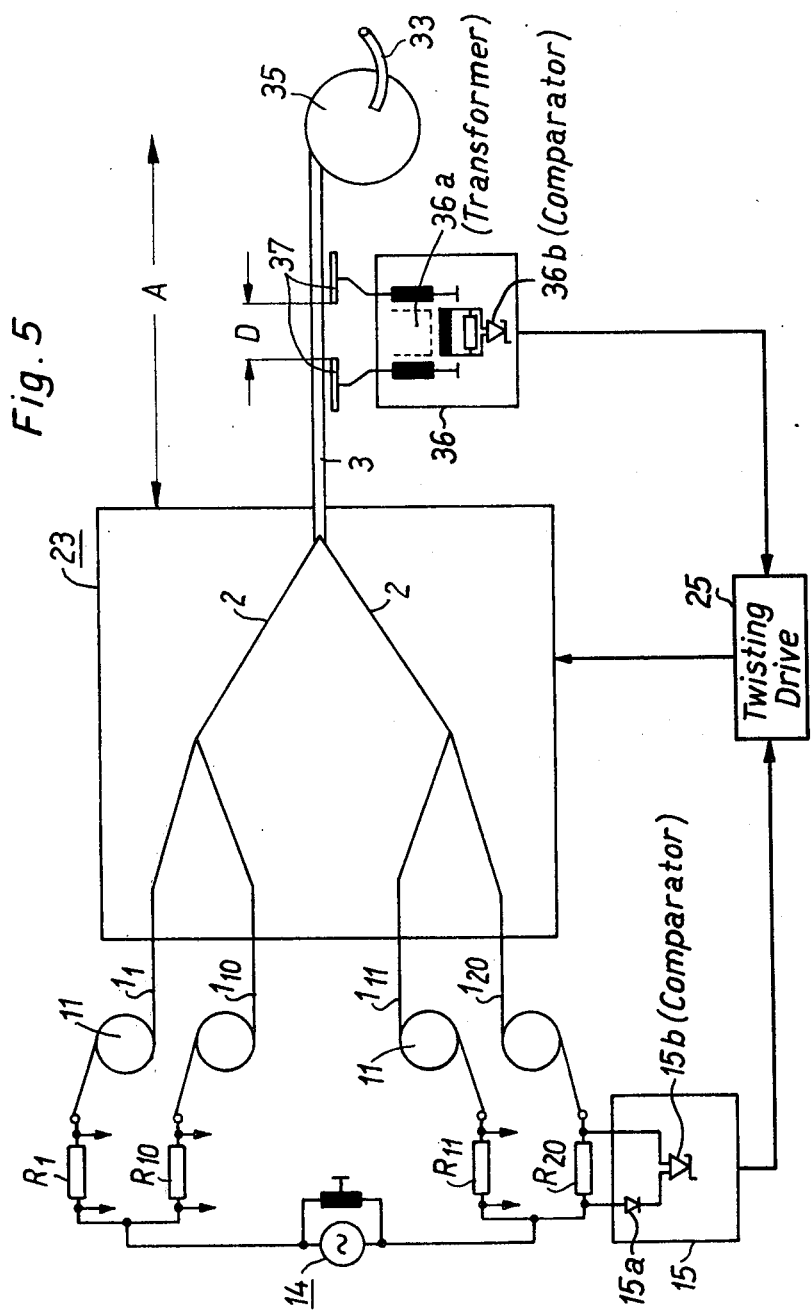

METHOD FOR LOCATING CONDUCTOR BREAKS DURING THE TWO STAGE TWISTING OF A COMMUNICATIONS CABLE

BACKGROUND OF THE INVENTION

This invention relates to twisted communication cables in general and more particularly to an improved method and apparatus for locating breaks in communication cables manufactured in a two stage twisting operation.

It is well known in the art to subject electrical cables and wires to a quality control test after manufacturing. Typically the cables are checked for interchanged conductors, conductor short circuits and conductor breaks. Particularly when testing communication cables, a large number of tests must be made. In addition to the types of tests noted above, tests to determine coupling properties of a cable are also necessary. To carry out such tests various production test equipment and methods have been developed to make possible to a large extent the automatic cycling of the individual tests. Typical are those methods and the apparatus disclosed in German Offenlegunsschrift 1,616,068 and German Auslegeschrift 1,947,569.

With one known method of determining interchanged, short circuited and interrupted conductors in multiconductor electrical cables, individual conductors of the cable are subdivided into a number of groups of series connected conductors and the terminal leads to these groups are each connected to a test relay. The switching states of the test relays are then indicated by indicator lamps. Such is described in German Auslegeschrift, 2,012,900.

In another prior art testing device optical means are used to automatically indicate faults such as interruption and conductor and ground shorts automatically. For this purpose the individual conductors are connected in series with test relays. Optical indicating elements for the type and location of faults and the simultaneous interruption of the test are controlled using contacts of the test relays. Such is disclosed in German Pat. No. 974,746.

The above described tests and methods have in common that the testing of the cables and wires takes place only after they are made, i.e., subsequent to the manufacturing process. The correction of faults which are located, e.g., the correction of the conductor break, thus necessitates a further operation in many cases, i.e., rewinding. In order to save an additional operation of this nature methods of testing during the fabrication of the cable, i.e., during the twisting of the cable conductors have been proposed. In such proposed methods the twisting process is stopped if deviations or faults are detected. For determining coupling in a twisted multiconductor communication cable made up of a number of pairs, for example, an arrangement for performing electrical production tests is known which makes possible production tests for all conductors of the cable during the fabrication. In this method corrections in the twisting operation such as a change in the location of the transposition point of the conductors can be carried out during the fabrication or can be performed automatically on the basis of an automatic evaluation of the measurement result. Such is disclosed in German Auslegeschrift 1,202,370. In another prior art arrangement, faults in the conductor insulation are determined during the twisting of the conductors with the detection of a fault resulting in an optical and/or acoustical indication and the stopping of the twisting process. In this arrangement which is disclosed in German Auslegeschrift 1,441,168 and a–c circuit which is closed through the ground capacities of the conductors is used as a measuring circuit.

The determination and correction of faults during the twisting of conductors into stranded units has not become an accepted practice because the correction of certain faults requires that the twisting process be stopped. As is well known such processes take place at high speed. Apart from the difficulty of localizing the fault accurately, stopping the twisting process causes a loss in production. Therefore up to this point it has been found more economical to perform the fault correction after the twisting operation is complete. That is this operation is carried as a separate operation particularly because of the relatively low frequency at which the faults occur.

Recently developed twisting techniques permit combining in a single operation twisting processes which were previously carried out separately. In particular, it is now possible to carry out the twisting of conductors to form stranded units such as pairs, triplets or spiral quads and then to twist several of such stranded units to form a twisted group also referred to as a base bundle all in one operation. Typically in these two stage twisting process at least the first twisting stage employs what is referred to as SZ twisting process in which twisting elements are twisted to form a stranded unit with alternating direction of twist. Clearly in such an operation the retwisting after the correction of faults can be a costly operation. As a result the need for a method and apparatus for carrying out fault detection during the twisting operation so that faults can be immediately corrected becomes evident.

SUMMARY OF THE INVENTION

The present invention provides a method and apparatus for carrying out such twisting during the manufacturing of communicacables being made in a two stage twisting process. In the twisting process to which the method of the present invention is applicable, conductors are pulled from stationary supply containers, twisted into units in a first twisting device, the units then twisted into a twisted group in a second twisting device after which the final twisted cable is wound on to a take up drum or reel. In accordance with the method of the present invention the conductors are connected to measuring or detector means and the twisting process is interrupted in dependence on the measurement data obtained from these measuring means. In order to determine conductor breaks occurring during the two stage twisted being performed in a single operation, an electrical voltage is applied to each conductor and the voltage thereon or current flowing therethrough monitored either continuously or at short intervals. Means are provided to indicate when a fault is detected, i.e., when the voltage or current deviates from a predetermined set limit. Furthermore in response to such a detection the twisting process is automatically either reduced in speed or completely stopped. An essential characteristic of the present invention is that the twisted cable be led through free air over a distance which is a multiple of the length of lay of the twisted cable prior to being wound on the take up reel. This permits applying a continuous a-c voltage to the conductor in which the fault has been discovered with the potential of the twisted cable probed in or ahead of the portion led through free air so that the exact fault location can be detected and the twisting process stopped. After such stopping a repair can be made and the process then continued.

It is thus possible with the method of the present invention to determine and localize conductor breaks which occur during twisting. This permits repairing these breaks while the twisted cable is still within the twisting apparatus. As noted above it is important that the twisted cable or twisted structure be led through air over a sufficiently long distance prior to being wound on the take up drum so that the twisting process can be stopped before the section containing fault has been wound on the take up drum. In a combined spiral quad-base bundle twisting process, i.e., one in which a plurality of spiral quads are twisted into a base bundle and which operates with a pull off speed of about 60 m/min, a distance of 6 m is sufficient for this purpose where the base bundle has a length of lay of 1 m. That is to say after the fault is located at the beginning of the distance leading through the air, a maximum of 6 seconds is available for stopping the twisting process. Such is sufficiently long under these circumstances.

The detection of a faulty conductor in accordance with the present invention can be done in a number of different ways. According to one disclosed method the end of the twisted structure which on the take up drum has applied to it an a-c voltage with the voltage supplied sequentially and in rapid succession to each conductor with the remaining conductors always grounded. The potential of each wire is detected before twisting and the twisting process influenced if a fault is detected or a voltage drops below a predetermined limit. As an alternate to this method, predetermined a-c voltages changing in time can be applied to the wires of the twisted structure with the simultaneous application to different wires of voltages of different frequencies. In order to prevent capacitive bridging of a conductor break by adjacent wires care must be taken that the internal resistances in the transmitters are sufficiently small in comparison to the impedances between wires.

In accordance with another disclosed embodiment of the method d-c voltages are used. A $d$-$c$ voltage is fed into each wire from the pull off end through a relay or series resistor coupled to a relay. At the take up reel the conductors are all connected to each other in an electrically conducting manner. The relay contacts are connected in series with the control circuit or drive means of the twisting machine. In this arrangement, should any conductor stop conducting due to a fault, or should its current fall below the holding current of the relay, the relay will drop out and the process will be interrupted.

For determining the exact location of the fault once the wire containing the fault has been determined a continuous a-c voltage is applied to the faulty wire from the take up drum and of the twisted structure, while the remaining conductors are grounded. The potential of the wires in the finished twisted structure is then probed in the region ahead of the take up drum, i.e., in the region where the twisted structure is freely led through air.

A particularly advantageous embodiment of the present invention consists of short circuiting all conductors at the end of the twisted structure located on the take up drum. The wires entering the twisting machine are divided into two groups of equal size. The two groups are connected to the terminals of an a-c voltage source which is symmetrical with respect to ground through high resistance series resistors. The voltage drop at the series resistors is then detected. With this arrangement the measuring voltage which is used for detecting a faulty wire is used at the same time for localizing the fault. It is fed in from the entrance side of the twisting machine, i.e., through the wire ends in the stationary wire supplies and thus no slip rings of any kind are required as would be the case if the wires were located on the take up reel. Furthermore no special circuit measures need be taken to electrically neutralize undamaged conductors in the twisted structure when localizing the fault.

For implementing the method of the present invention an apparatus is disclosed which is particularly advantageous. In this apparatus the wires run form stationary wire supplies and then pass through the twisting device from which they are fed to a take up drum. Measuring devices for testing, indicating and evaluating faults are connected to the wires. In such an apparatus, the fault is preferably localized using capacitive probing of the twisted structure ahead of the take up drum by using an electrode shaped probe which is associated with the twisted structure. A preferred type of probe in a tubular electrode through the twisted structure passes and which will advantageously be designed as a differential electrode. However, it is also possible to use a metallic deflection pulley designed as an electrode with the twisted structure looped one or more times over the deflection pulley.

To probe the wire potential for detecting a faulty wire using an a-c voltage which is symmetrical with respect to ground, electrodes which comprise metallic rollers over which the respective wire is looped one or more times are particularly useful. These electrodes are arranged ahead of the twisting apparatus itself, i.e., between the wire supplied and the twisting apparatus. However, it is also possible to loop all of the wires around a common metallic roller or a metallic cylinder which is used as the electrode.

BRIEF DESCRIPTION OF THE DRAWINGS

FIG. 1 is a block diagram illustrating a twisting process to which the method of the present invention is applied.

FIG. 1A illustrates an alternate form of the method of FIG. 1.

FIG. 2 is a block diagram illustrating an alternate method which may be used.

FIG. 3 is a circuit diagram illustrating the circuit which results from the embodiment of FIG. 2.

FIG. 4 illustrates the arrangement of the relay contacts of the relays of FIG. 3 which permit controlling the process.

FIG. 4A illustrates an alternate to the arrangement of FIG. 3.

FIG. 5 is a block-circuit diagram illustrating an embodiment for practicing the method of the present invention using an $a$-$c$ source symmetrical with respect to ground.

DETAILED DESCRIPTION OF THE PREFERRED EMBODIMENT

FIG. 1 is a block diagram representation of a two stage switching apparatus to which the method and apparatus of the present invention can be applied. Illustrated is a two stage twisting device 23. Wires 1 are fed from stationary wire supplies 11 over pulleys 13, and through distributor discs 12 to the twisting apparatus 23. Within this apparatus is a first twisting stage comprising a plurality of SZ twisting devices 21 operating in parallel and disposed side by side. In these devices the wires are twisted to form stranded units such as pairs or spiral quads. The pairs or spiral quads so formed are then provided to a second twisting stage or twisting device 22 which may also be an SZ twisting arrangement. The parallel twisted units 2 are in this device 22 twisted into a base bundle or twisted cable 3. The cable or twisted structure 3 is subsequently wound onto a take up drum 32 contained within a take up arrangment 31.

When the detection of faults in such cables is being considered it can be assumed that conductor breaks occur before the cable 3 is wound on the take up drum 32. As a result a detected fault can be corrected while the cable is still within the zone of the machine. As illustrated on FIG. 1 the apparatus is set up so that there is region between the twisting apparatus 23 and the take up drum 32 where the cable 3 runs through free air. The distance indicated as A is made sufficiently long so that a conductor break occurring before the cable 3 enters this section will still be within or ahead of the section A once the the twisting process has been stopped. As will be described in more detail below if a fault is detected and the fault is still ahead of the section A the apparatus can be operated at slow speed to move the fault to within the section A.

In accordance with the first embodiment of the method of the present invention, an a-c voltage is applied sequentially to each conductor in the finished bundle 3. To accomplish this an a-c source 41 is coupled to a distributor 43 which sequentially applies the a-c voltage through slip ring 42 to each of the conductors in the end 33 of the cable 3. The distributor 43 may be an arrangement containing electronic switches or a mechanical switching arrangement such as a stepper switch. Electronic switches however are preferable since a much greater sequencing frequency can be obtained. In conventional fashion, the twisting apparatus will be driven by a twisting drive 25. As noted above this will normally be operated at high speed and must be slowed down and/or stopped when a fault is detected. To detect a fault a plurality of capacitive electrodes are provided at entrance end of the twisting apparatus 23. These devices may simply be pulleys 13 designed as electrodes. These probes are connected to a detector 15 apparatus which can contain for example a plurality of comparators or the like. One channel will be provided in detector 15 for each wire. Also associated with each wire in the detector will be an indicator 15A to indicate in which wire a fault is located should a fault occur. An output from the detector 15 indicating a fault in one of the wires is provided as an input to the twisting drive 25 to cause it to be slowed or stopped should a fault indication occur or the voltage at one of the detector inputs dropped below a given limit.

It is essential that the wire being tested and which has a break as near as possible to zero potential at the end away from the a-c source so that the interruption cannot be capacitively bridged through undamaged adjacent wires. Because of this all wires of the base bundle accept the one to which a voltage is applied will have a ground potential applied thereto by the distributor 43.

The distributor 43 which will, in conventional fashion, be sequenced by the use of some type of clock mechanism will typically be synchronized with the detector 15 so that a fault can be located through the detection of the pulse train appearing at the output of the capacitive electrodes 13 and comparison with the synchronizing pulses provided out of the distributor. That is to say, each time the distributor advances in response to a synchronizing pulse a pulse should be detected out of one of the electrodes 13. If such does not occur or if the pulse is too weak a fault is present and the detector can then be latched up to provide an output indication and stop or slow the twisting device. The type of circuits and devices necessary to carry this out are well known in the art and will not be described in detail herein.

Once the faulty wire is determined the exact fault location must be determined. For this purpose there is provided, within the secion A, a probe 34 which is capacitively coupled to the entire base bundle 3. The capactive probe 34 shown simply as a block on the Figure may comprise a tubular capacitive electrode or may be a pulley such as the pulleys 13 with the bundle 3 looped one or more times around it.

As soon as the faulty wire is detected a continuous a-c voltage is connected to the faulty wire with all the other wires grounded. This may be done by manually setting the distributor to the faulty wire or may be done by feeding back from the de15 an indication of the fault location to stop the distributor at that point. Once this is done the output of the capacitive probe 34 is checked in a detector 36. This may simply be a comparator device which determines whether or not the detected voltage is above a predetermined limit. If the voltage on the probe is above a predetermined limit the fault is still ahead of the beginning of section A, i.e, ahead of the measuring electrode 34 and must first be moved into the zone of section A. If on the other hand, the potential of the measuring electrode 34 is zero or lower than the predetermined limit the fault is already within the section A. This information can be used to control the twisting drive 25. That is to say, once a faulty wire is detected by detector 15 the twisting drive 25 will be caused to run at a reduced speed. This reduced speed will continue until the voltage from the capacitive probe or measuring electrode 34 drops below the predetermined limit at which point the fault will be within the section A. Of course, if the detector 36 is indicating a voltage of zero or below the predetermined limit at the time when detector 15 indicates a fault the drive will be immediately stopped.

Once the twisting process is stopped the machine operator can then determine the exact location of the fault using, for example, a moveable capacitive probe or through use of an electrical needle probe after which he can make appropriate repairs.

The method described above can also be carried out such that the a-c voltage is set in and wires grounded at the entrance side of the machine, i.e., at the wire supplies 11. In such a case one would use a single measuring electrode at the entrance of the section A. Since the distributor and detector are synchronized the wire containing the fault could still be identified. However this alternate method has a disadvantage in that the fault is only located after it has entered the section A.

Rather than sequencing the a–c voltage, voltages at different frequencies may be uses as illustrated by FIG. 1A. Here a source 41a provides power to a frequency generator 43a providing different frequency outputs $f_1$–$f_5$ for each of the conductors. In detector 15 tuned circuits may then be used to isolate the faulty conductor.

An embodiment employing d–c voltages is illustrated on FIGS. 2, 3 and 4. On FIG. 2, the twisting apparatus 23 and twisting drive 25 shown and are essentially the same as that of FIG. 1. Similarly a capacitive probe 34 and associated detector 36 will be provided but are not shown on this Figure for sake of simplicity. Determination of the exact fault location will be in the manner described above. However for determining the location of the faulty wire a different arrangement is used. At the end 33 of the bundle 3 all conductors are short circuited together by simply twisting them together or the like. At the supply spools 11, a d–c voltage is provided to each of the wires $1_1$–$1_{20}$ at their wire ends indicated as $1_a$–$1_u$. The voltage is provided by a d–c source 19 through a relay arrangement 20 to the wire ends $1_a$–$1_u$. The relay contact are connected in series and an output provided to the twisting drive 25. The circuit arrangement is shown in more detail on FIGS. 3 and 4. Shown on FIG. 3 are the two output terminals 17 and 18 of the d-c source 19. The positive terminal is connected through relays coils $D_1$–$D_{10}$ to the wires $1_1$–$1_{20}$. Similarly the negative terminal of the d-c sources 18 is connected through the relay coils $D_{11}$–$D_{20}$ to the wires $1_{11}$–$1_{20}$. Shown on FIG. 4 are the contacts associated with theses relay coils $D_1$–$D_{20}$. As illustrated contacts are all connected in a series arrangement 16 which may then be coupled in series between a voltage source and the twisting drive 25 so that upon the opening of any relay contact the twisting drive will be stopped or slowed. Only if all wires in the bundle are conducting will all relay contacts be closed and normal operation of the twisting drive be possible. That is to say only when current is flowing through the respective relay coils $D_1$–$D_{20}$ will operation occur. Should a conductor break occur causing current to stop flowing or should some other fault occur causing current to be reduced below the drop out current of the respective relay the relay contacts will open and the twisting drive will be stopped. Thereafter, the exact fault location may be determined in the manner described above. As illustrated by FIG. 4A, which illustrates the circuit for only one wire, a relay coil $D_1$, rather than being placed directly in series with a conductor can be placed across a resistor $R_1$ which is series with the conductor $1_1$. In such a case the voltage drop across the resistor is used to operate the relay. Should this voltage drop become too small the relay will drop out and the drive will be stopped.

FIG. 5 illustrates a particularly advantageous embodiment. In the twisting apparatus 23 wires $1_1$ through $1_{20}$ are twisted to form spiral quads 2 using an SZ twisting arrangement with the spiral quads 2 then formed into a base bundle 3 using a pull off device which rotates about the twisting axis but is not shown in detail. The take up drum 35 in an apparatus of this nature is also caused to rotate about the twisting axis. The twisting is carried out in a somewhat different manner in this type of apparatus. However as to the method of the present invention this makes no significant difference. In accordance with the embodiment of FIG. 5 and a–c voltage which is symmetrical with respect to ground is developed in a voltage generator 14. Symmetry with respect to ground is obtained through the use of a symmetrical choke 14a associated with the voltage source and which has its center tap grounded. The conductors $1_1$–$1_{20}$ are divided into two equal groups and each group coupled, through high series resistances $R_1$–$R_{20}$ to the two sides of the d–c source 14. At the end 33 of the bundle 3 all of the wires are shorted together. Continuous monitoring of each of the conductors is accomplished by measurement of the voltage drop at the series resistors $R_1$–$R_{20}$ using measuring detector 15. Measuring detector 15 is illustrated with the measuring devices for one resistor. As shown a rectifier diode 15a is provided along with a comparator 15b which will provide an output independence on the voltage drop across the resistors. The individual comparator outputs for each of the resistors may be used in the manner described above to control the twisting drive 25 and to provide a visual or other indication of the faulty wire. To determine the exact location of the conductor break a probe electrode 37 which is coupled to a detector device 36 is used. The probe electrodes 37 are arranged in the section A between the twisting apparatus 23 and the take up device 35. A preferred type of electrode is one which is a tubular capacitive electrode surrounding the bundle. As shown the electrode is in two sections. Rather than using such a tubular electrode, a pair of rollers or pulleys insulated with respect to ground over which the base bundle 3 is looped may also be used. If a conductor break is detected at the detector 15, the speed can be slowed down and the break will subsequently run through the measuring electrode 47. When such occurs a registrable change in the detected current resulting from the potential difference between the wire end facing the source and that facing away from the source will occur. Because a voltage source 14 which is symmetrical with respect to ground and high resistance series resistors $R_1$–$R_{20}$ are used, all the undamaged wires of the bundle will essentially at ground potential and furnish no measuring current component. To suppress synchronous interference the electrode, as indicated, is preferrable a two piece differential electrode.

In the manner noted above it is preferable that once the faulty wire is detected, the output from the detector 15 is used to first automatically reduced the machine speed with the machine being finally stopped when the fault is situated in the area of the measuring electrode 37.

The essential characteristics of the method illustrated by FIG. 5 in summary as as follows. A transmitted a-c voltage referred to ground by a symmetrical choke is applied to the free wire ends of the stationary wire supply reels 11 through high resistance series resistors $R_1$–$R_{20}$. The wires are connected in two groups of equal size to the opposite poles of the voltage source 14. All conductors are shorted to each other by twisting them together at the end 13 of the base bundle 3 at the pick up reel 35. Two electrodes, tubular electrodes or rollers insulated with respect to ground and forming a measuring electrode 37 are arranged at a fixed distance D apart from each other between the twisting apparatus 23 and the rotating pickup arrangement 35. The electrodes capacitively probe the potential of the wires in the base bundle. As illustrated, the electrodes are connected so as to buck each other through a differential transformer 36a which has its output winding coupled to a comparator 36b''.

In the conductor loops formed by the wire short circuits current components flow producing voltage drops at the series resistors R. The voltage drops depend primarily on the condition of the wires. If high resistance resistors are used having a resistance at least ten times the resistance of the respective wire, the resulting voltage change, should a conductor break, will be about 40% of the transmitted voltage amplitude and can readily be detected. As illustrated on the Figure this voltage drop can then be evaluated using a rectifier 15a and comparator 15b shunted across the respective resistor. This comparator output then provides signals correlated to the individual wires which can be used to give an indication that the wire is "undamaged" or "broken". That is to say the outputs of the comparator can be coupled through appropriate logic circuits to indicator lamps so designated.

An exact fault location is determined through the use of a measuring electrode 37 comprising two capacitive electrodes arranged at a fixed distance from each other. All wires are coupled to the two electrodes through essentially equal capacities. Depending on the wire potentials, measurable current components flow in the differential windings of the transformer 36a. The difference of these current components can then be detected. Since undamaged wires, measured over the length of the capacitive electrodes, will have a practically constant potential the two current components, assuming uniform coupling between the wires and electrodes are equal, i.e., the difference between the current components is zero and corresponding zero output from the transformer 36a will result. However, should conductor break, when the fault becomes situated between the two capacitive electrodes, the current in one differential winding will be different than that in the other because of the potential difference between the two conductor ends. The conductor end facing the take up arrangement is connected to the voltage of the wire short circuit, i.e. it is practically at ground potential. The other end is connected through the corresponding series resistor to the transmitter voltage. As the fault goes through the measuring electrode 37, a measurable change of the current from the normal case will occur. This can then be evaluated using the comparator 36b and additional amplifiers and/or logic circuits in conventional fashion to provide an output indication on a lamp or the like indicating such things as "fault outside the electrodes" and "fault within the electrodes".

Furthermore as also noted a conductor break once detected can be used to provide a first signal to reduce the pull off velocity of the twisting drive 25 and a second signal from the detector 36 to finally stop the drive when the fault passes through the measuring electrode. With the type of arrangement illustrated on FIG. 5 the fault can be easily located as being situated within a distance of for example 0.5m between two capacitive electrodes. Furthermore, with the arrangement herein the output from the detector 15 can be used to operate a lamp identifying by numeral the wire involved.

The current measuring electrode 37 will preferrably comprise two capacitive electrodes in the form of two tubes having a length greater than the length of lay of the base bundle and arranged at a distance of about 0.5 m from each other. Preferably the diameter of the electrodes should match the cross section of the twisted base bundle in order to obtain optimum coupling of the measuring electrodes to the wires. Thus, interchangeable electrodes are preferred so that the electrode can be matched to the individual bundle being processed. Such may be accomplished for example by using electrodes which are split lengthwise and can be hinged open under spring tension.

Thus an improved method and apparatus for detecting and locating faults during a two stage twisting operation has been described. Although specific embodiments have been illustrated and described, it will be obvious to those skilled in the art that various modifications may be made without departing from the spirit of the invention which is intended to be limited solely by the appended claims.

What is claimed is:

1. A method for testing the conductors in the wires of a communication cables while they are being twisted in a device in which the wires being twisted are pulled from stationary supply containers and after being twisted in two stages into a finished twisted base bundle are wound on to a take up reel and correcting localized faults comprising the steps of:
   a. applying an electric voltage to each conductor;
   b. detecting one of the voltage present on and current flowing through each wire to determine if it is within predetermined limits;
   c. providing a first output indication if said voltage or current in any wire falls outside that limit;
   d. slowing or stopping the twisting process in response to said first output indication;
   e. for the purpose of localizing the fault, leading the finished base bundle freely through air prior to being wound on the take up reel through a distance which is a multiple of the length of lay of the base bundle;
   f. applying a continuous a–c voltage to the conductor detected as being outside limits in step b);
   g. probing the base bundle in or ahead of the zone through which it is led through free air;
   h. stopping the twisting process completely when the fault is localized within said zone; and
   i. correcting said fault.

2. The method according to claim 1 wherein said step of applying a voltage comprises applying an a–c voltage sequentially in rapid succession to each conductor in the base bundle from the end of the base bundle on the take up drum while at the same time grounding all other conductors, detecting the voltage of each wire at a point prior to the wire being twisted and influencing the twisting process if a fault indication if found or if a voltage drops below a predetermined limit.

3. The method according to claim 2 wherein the detection of said potential is accomplished by looping each conductor at least once around a metallic pulley designed as an electrode.

4. The method according to claim 1 wherein for the detecting of step b) all conductors are looped around a common cylindrical structure designed as an electrode.

5. The method according to claim 1 wherein said step of applying a voltage comprises simultaneously applying a–c voltages of different frequencies to each of the different conductors of the twisted structure from the end of the twisted structure which is on the take up drum and detecting the voltage at each wire before twisting and influencing the twisting process if a fault is indicated or if voltage drop below a predetermined limit.

6. The method according to claim 5 wherein the detection of said potential is accomplished by looping each conductor at least once around a metallic pulley designed as an electrode.

7. The method according to claim 1 wherein said step of applying a voltage comprises applying a d–c voltage to each wire from the side of the stationary supply container, with each of said wires coupled to operate a relay, electrically connecting the wires of the base bundle to each other at the end on the take up drum; and connecting the relay contacts in series with the drive circuit of the twisting apparatus.

8. The method according to claim 7 wherein said relays are coupled with their coils in series with the individual conductors.

9. The method according to claim 7 wherein a series resistor is coupled in series with each of said conductors and said relays operated by the voltage across said series resistor.

10. The method according to claim 1 wherein all conductors of the base bundle are short circuited to each other at the end of the twisted structure on the take up reel; the conductors are divided into two groups of equal size at the entrance end of the twisting apparatus and are connected to the terminals of an $a$–$c$ voltage source symmetrical with respect to ground through high resistance series resistors; and the voltage drop at each of the series resistors is detected to locate a faulty conductor, said $a$–$c$ voltage also supplying the voltage of step (f) in claim 1.

* * * * *

UNITED STATES PATENT AND TRADEMARK OFFICE
CERTIFICATE OF CORRECTION

PATENT NO. : 3979897
DATED : SEPTEMBER 14, 1976
INVENTOR(S) : DIETER VOGELSBERG ET AL

It is certified that error appears in the above-identified patent and that said Letters Patent are hereby corrected as shown below:

Col. 4, line 27, delete "in" and insert instead --is--;

Col. 7, line 6, after "25" insert --are--;

Col. 8, line 29, delete "47" and insert instead --37--;

Col. 10, line 44 (Claim 2), delete "if" (second occurrence) and insert instead --is--.

Signed and Sealed this

Fifteenth Day of March 1977

[SEAL]

Attest:

RUTH C. MASON
Attesting Officer

C. MARSHALL DANN
Commissioner of Patents and Trademarks